United States Patent
Feng et al.

(10) Patent No.: US 12,278,296 B1
(45) Date of Patent: Apr. 15, 2025

(54) METHOD FOR MANUFACTURING BACK-CONTACT SOLAR CELL AND BACK-CONTACT SOLAR CELL

(71) Applicant: ZHEJIANG JINKO SOLAR CO., LTD., Zhejiang (CN)

(72) Inventors: Xiu Feng, Zhejiang (CN); Menglei Xu, Zhejiang (CN); Jie Yang, Zhejiang (CN); Xinyu Zhang, Zhejiang (CN)

(73) Assignee: ZHEJIANG JINKO SOLAR CO., LTD., Zhejiang (CN)

(*) Notice: Subject to any disclaimer, the term of this patent is extended or adjusted under 35 U.S.C. 154(b) by 0 days.

(21) Appl. No.: 18/592,500

(22) Filed: Feb. 29, 2024

(30) Foreign Application Priority Data

Dec. 7, 2023 (CN) .......................... 202311675825.9

(51) Int. Cl.
- *H01L 31/0224* (2006.01)
- *H01L 31/0236* (2006.01)
- *H01L 31/18* (2006.01)

(52) U.S. Cl.
CPC ...... *H01L 31/022441* (2013.01); *H01L 31/18* (2013.01); *H01L 31/02363* (2013.01)

(58) Field of Classification Search
CPC ............... Y02P 70/50; H01L 31/02167; H01L 31/1864; B23K 26/362
See application file for complete search history.

(56) References Cited

U.S. PATENT DOCUMENTS

2014/0295613 A1  10/2014  O'Sullivan

FOREIGN PATENT DOCUMENTS

| CN | 102160192 A |   | 8/2011  |               |
|----|-------------|---|---------|---------------|
| CN | 103794679 A |   | 5/2014  |               |
| CN | 107785456 A |   | 3/2018  |               |
| CN | 112736163 A |   | 4/2021  |               |
| CN | 113871494 A |   | 12/2021 |               |
| CN | 113540269 B | * | 4/2022  | ...... H01L 31/02167 |
| CN | 115188857 A | * | 10/2022 | ........... B23K 26/362 |
| CN | 114823991 B |   | 11/2022 |               |
| CN | 115274915 A | * | 11/2022 |               |
| CN | 115483311 A | * | 12/2022 |               |
| CN | 116111006 A |   | 5/2023  |               |

(Continued)

OTHER PUBLICATIONS

Zhejiang Jinko Solar Co., Ltd., CN Notification to Grant patent right for Invention with English translation, CN 2023116758259, Jan. 18, 2024, 7 pgs.

(Continued)

*Primary Examiner* — Edward Chin
(74) *Attorney, Agent, or Firm* — USCH Law, PC (57) ABSTRACT

A method for manufacturing a back-contact solar cell and a back-contact solar cell are provided. The method includes the following. A substrate having a first surface is provided, where the first surface includes first regions and second regions that are alternatingly arranged in a preset direction. First doping layers are formed over the first regions, second doping layers having different conductivity types of the first doping layers are formed over the second regions, and a mask layer is formed on the first doping layers. The respective second doping layer includes two first portions and a second portion arranged in the preset direction, the first portion is abutted on the respective first doping layer.

18 Claims, 6 Drawing Sheets

(56) References Cited

FOREIGN PATENT DOCUMENTS

| | | | |
|---|---|---|---|
| CN | 116632093 A | | 8/2023 |
| JP | 2016521244 A | * | 7/2016 |
| WO | 2012166749 A2 | | 12/2012 |
| WO | 2023041177 A1 | | 3/2023 |

OTHER PUBLICATIONS

Zhejiang Jinko Solar Co., Ltd., Extended European Search Report, EP 24159203.9, Aug. 28, 2024, 37 pgs.

* cited by examiner

METHOD FOR MANUFACTURING BACK-CONTACT SOLAR CELL AND BACK-CONTACT SOLAR CELL

CROSS REFERENCE TO RELATED APPLICATIONS

The present application claims the benefit of priority under the Paris Convention to Chinese Patent Application No. 202311675825.9 filed on Dec. 7, 2023, which is incorporated herein by reference in its entirety.

TECHNICAL FIELD

The various embodiments described in this document relate in general to the field of solar cells, and more specifically to a method for manufacturing a back-contact solar cell and the back-contact solar cell.

BACKGROUND

Solar cells have good photoelectric conversion capability, and a back-contact cell of the solar cells is a new cell structure with no electrode shielding on the front of the cell and alternating P-type regions and N-type regions on the back of the cell.

In order to avoid electrical interference between the P-type regions and the N-type regions on the back of the cells, it is necessary to separate the P-type regions from the N-type regions. In the actual fabrication process, a patterning process is used to form isolation regions between P-type regions and N-type regions.

However, the current patterning process is tedious and easy to damage the P-type regions or N-type regions, which leads to the poor photoelectric conversion performance of the prepared solar cells.

SUMMARY

The embodiments of the disclosure provide a method for manufacturing a back-contact solar cell and the back-contact solar cell, which is beneficial to at least simplifying the preparation process of the back-contact solar cell and maintaining better photoelectric conversion performance of the back-contact solar cell.

Embodiments of the disclosure provide a method for manufacturing the back-contact solar cell. The method includes the following. A substrate having a first surface is provided, where the first surface includes first regions and second regions that are alternatingly arranged in a preset direction. First doping layers are formed over the first regions, where a respective first doping layer is over a respective first region. Second doping layers are formed over the second regions, where a respective second doping layer is over a respective second region, and mask layers are formed on respective ones of the first doping layers during forming the first doping layers over the first regions and forming the second doping layers over the second regions. The respective first doping layer and the respective second doping layer have different conductivity types, and each of the second doping layers includes two first portions and a second portion arranged in the preset direction. The second portion is abutted on two opposite sides by the two first portions, and each of the first portions of the second doping layers abuts a first doping layer. Laser modification treatment is performed on the second portions of the second doping layers to convert the second portions into target second doping layers. An etching process is performed on the first portions and the target second doping layers to remove the first portions, such that the first doping layers are separated from the target second doping layers by gaps, where an etching rate at which the target second doping layers are etched is lower than an etching rate at which the first portions are etched in the etching process. The mask layers are removed.

In some embodiments, in the etching process, the first portions and a partial thickness of the substrate directly facing the first portions are removed.

In some embodiments, a ratio of a width of the respective first portion to the width of a respective second portion in the preset direction is in a range of 0.09 to 2.

In some embodiments, performing the laser modification treatment on second portions of the second doping layers includes: performing the laser modification treatment on the second portions from a surface of a respective second portion, to convert the respective second portion of at least a partial thickness into a modified layer, where the modified layer and a remaining portion of the respective second portion become a corresponding target second doping layer, where an etching rate at which the modified layer is etched is lower than an etching rate at which the first portions are etched in the etching process.

In some embodiments, the respective second portion of the partial thickness is converted into the modified layer by the laser modification treatment, and the first portions and the modified layer are removed in the etching process.

In some embodiments, a material of the second doping layers includes polysilicon.

In some embodiments, a material of a modified layer includes amorphous silicon.

In some embodiments, a laser power of laser used for the laser modification treatment is in a range of 5 W to 40 W.

In some embodiments, the modified layer includes: an amorphous silicon layer and a silicon oxide layer that are stacked in sequence in a direction away from the substrate, where in the etching process, the silicon oxide layer is etched at an etching rate lower than an etching rate at which the first portions are etched, and the amorphous silicon layer is etched at an etching rate lower than an etching rate at which the first portions are etched, and where the silicon oxide layer is removed in the etching process.

In some embodiments, the etching process is an alkali etching process.

In some embodiments, process parameters for the alkali etching process includes: an etching liquid being a NaOH solution with a mass concentration of 0.5% to 5%, a temperature of the etching liquid being 60° C. to 80° C., and a process duration being 240 s to 500 s.

In some embodiments, the method further includes: after the first doping layers doped with a first doping element are formed, forming the second doping layers, includes: forming polysilicon layers on the second regions, where a respective polysilicon layer is formed over the respective second region; and performing a diffusion process on the polysilicon layers, to implant a second doping element, having a conductivity type that is different from a conductivity type of the first doping element, into the polysilicon layers to convert the polysilicon layers into the second doping layers.

In some embodiments, the method further includes during forming second doping layers over the second regions: forming second doping layers over the first doping layers, where the second doping layers over the first doping layers constitutes the mask layer; and removing the second doping layers over the first doping layers in the etching process.

In some embodiments, the method further includes: forming a first passivation layer, where the first passivation layer is disposed on the first doping layers and the target second doping layers, and the first passivation layer further fills gaps between the first doping layers and the target second doping layers.

In some embodiments, a back-contact solar cell, prepared by the method described above, where the back-contact solar cell includes: a substrate having a first surface; and first doping layers and target second doping layers that are arranged alternatingly on the first surface in the preset direction, where the first doping layers and the target second doping layers have different conductivity types, and a respective first doping layer and an adjacent target second doping layer are spaced apart from each other.

In some embodiments, the target second doping layers include at least amorphous silicon layers.

BRIEF DESCRIPTION OF THE DRAWINGS

One or more embodiments are illustrated by the figures in the corresponding drawings, which are not to be limiting to the embodiments, and the figures in the drawings are not to be limiting to scale unless specifically stated.

DETAILED DESCRIPTION OF THE EMBODIMENTS

As used herein, features (e.g., regions, structures, devices) described as "adjacent" to each other mean and include features having one or more of the disclosed identities and located closest (e.g., closest) to each other. One or more of the disclosed identified additional features (e.g., additional regions, additional structures, additional devices) that are not the "adjacent" features may be disposed between the "adjacent" features. In other words, the "adjacent" features may be positioned directly adjacent to each other so that no other features are interposed between the "adjacent" features. Alternatively, "adjacent" features may be located indirectly adjacent to each other, such that at least one feature having an identity other than an identity associated with the at least one "adjacent" feature is located between the "adjacent" features. Thus, features described as "vertically adjacent" to each other mean and include features disclosed by one or more identifiers located vertically closest (e.g., most vertically proximate) to each other. In addition, features described as "horizontally adjacent" to each other mean and include one or more of the disclosed identified features located horizontally closest (e.g., most horizontally proximate) to each other.

In the following description, a second portion being formed or disposed over or on a first portion, or on the surface of the first portion, or on one side of the first portion, may include a solution in which the first portion and the second portion are in direct contact, and may also include a solution in which additional parts may be provided between the first portion and the second portion, so that the first portion and the second portion may not be in direct contact. For the sake of simplicity and clarity, various parts can be drawn arbitrarily at different scales. In the drawings, some layers/parts may be omitted for simplicity. Unless otherwise specified, the second part is formed or disposed on the surface of the first part, which means that the first portion is in direct contact with the second portion.

The above-mentioned "member" may refer to a layer, a film, a region, a part, a structure, or the like.

Further, for case of description, spacing relative terms such as "under", "below", "lower", "above/on", and "upper" may be used herein to describe a relationship between one element or component and another (or other) element or component as shown. In addition to the orientations shown in the figures, the spacing relative terms are intended to encompass different orientations of the device in use or operation. The device may be oriented in other ways (rotated 90 degrees or in other orientations) and the spacing relative terms used herein may similarly be interpreted accordingly. In addition, the term "made of/from" can mean "containing" or "consisting of". Further, in subsequent manufacturing processes, one or more additional operations may exist during/between the described operations and the sequence of operations may be changed. In the following embodiments, the terms "upper", "above", and/or "upper" are defined in a direction in which the distance from the front surface or the rear surface increases. Materials, configurations, dimensions, processes, and/or operations as illustrated in the embodiments may be employed in other embodiments and their detailed description may be omitted.

As used herein, spatial relative terms such as "under", "below," "bottom," "above," "upper," "top," "front," "back," "left," "right," and the like may be used for case of description to describe the relationship of one element or feature to another element or feature as illustrated in the figures. Unless otherwise specified, the spatial relative term is intended to encompass different orientations of material other than those depicted in the illustration. For example, if the material in the illustration is inverted, elements described as "under", "below", or "at the bottom" of other elements or features will be oriented "above", "upper", or "at the top" of other elements or features. Therefore, the term "below" may encompass both upper and lower orientations depending on the context in which the term is used as will be apparent to those of ordinary skill in the art. The materials may be oriented in other ways (e.g., rotated 90 degrees, inverted, flipped) and the spatial relative terms used herein may be interpreted accordingly.

According to the background technology, the graphical process used in the preparation of back-contact solar cells at present is cumbersome, which may easily cause the problem of poor photoelectric conversion performance of the prepared solar cells.

It is found that one of the reasons for the above problems is as follows. At present, the surface of the substrate of the back-contact solar cell has first doping layers and target second doping layers that are alternatingly arranged, the first doping layer and the target second doping layer have different conductivity types, and the first doping layer and the target second doping layer are isolated from each other. In order to separate the first doping layer from the target second doping layer, a patterning process needs to be performed between the first doping layer and the target second doping layer to separate the first doping layer from the target second doping layer. At present, there are three methods for performing the patterning process. 1. Lithography technology: patterning of the first doping layers and the target second doping layers may be formed respectively through multiple masks and lithography. 2. Ion implantation technology: mask and laser slotting are performed, and then ion implantation is performed between the first doping layers and the target second doping layer to form a patterning region. 3. Printing of doped slurry/paste: a diffusion region is formed through a mask and laser slotting, and boron/phosphorus paste is printed to form patterning between the first doping layers and the target second doping layers. However, the patterning between the first doping layers and the target second doping layers by the lithography technology is expensive, the patterning between the first doping layer and the target second doping layer by the ion implantation technology is unstable in doping, and there are many cleaning steps in printing of the doping paste. Moreover, since the patterning needs to be realized through multi-step mask or printing steps, it may cause certain process damage to the first doping layers or the target second doping layers, which is not conducive to maintaining the normal performance of the first doping layers and the target second doping layers, and thus may affect the photoelectric conversion performance of the back-contact solar cell.

Embodiments of the disclosure provide a method for manufacturing a back-contact solar cell. A second portion of a second doping layer is subjected to laser modification treatment to form a target second doping layer. In the etching process, an etching rate at which the target second doping layer is etched less than an etching rate at which the first portions without laser modification. By using an etching selectivity ratio, first portions between the target second doping layers and the first doping layers are removed and the target second doping layers after laser modification are retained. In the above steps, there is no need to go through multi-step mask or printing steps to realize patterning, which greatly simplifies the process flow. In addition, it can prevent the problem that the photoelectric conversion performance of the back-contact solar cell is damaged due to the process damage caused by the complex patterning process to the target second doping layer.

Embodiments of the present disclosure will be described in detail below with reference to the accompanying drawings. However, one of ordinary skill in the art will appreciate that in various embodiments of the present disclosure, numerous technical details have been provided in order to enable the reader to better understand the present disclosure. However, even without these technical details and various variations and modifications based on the following embodiments, the technical solutions claimed in the present disclosure may be realized.

Figure 1:
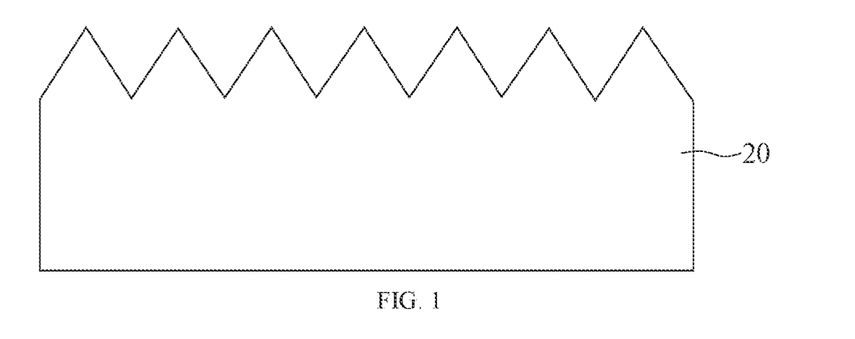
FIG. 1 is a schematic cross-sectional view of a structure corresponding to steps of providing an initial substrate in a method for manufacturing a back-contact solar cell according to embodiments of the present disclosure.
Figure 2:
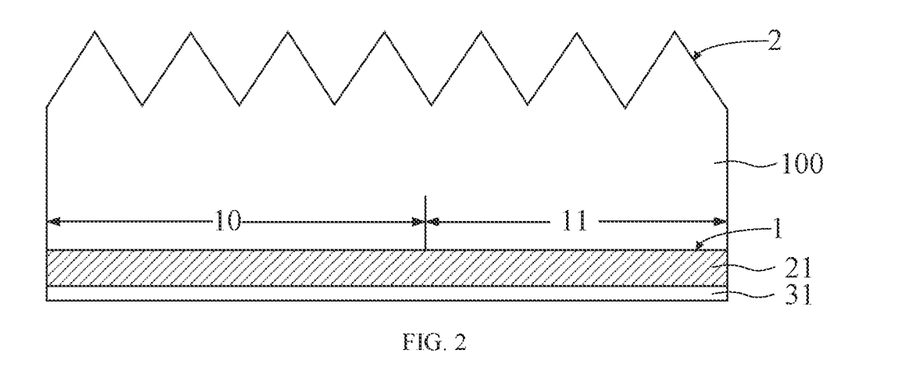
FIG. 2 is a schematic cross-sectional view of a structure corresponding to steps of forming an initial first doping layer in a method for manufacturing a back-contact solar cell according to embodiments of the present disclosure.
Figure 3:
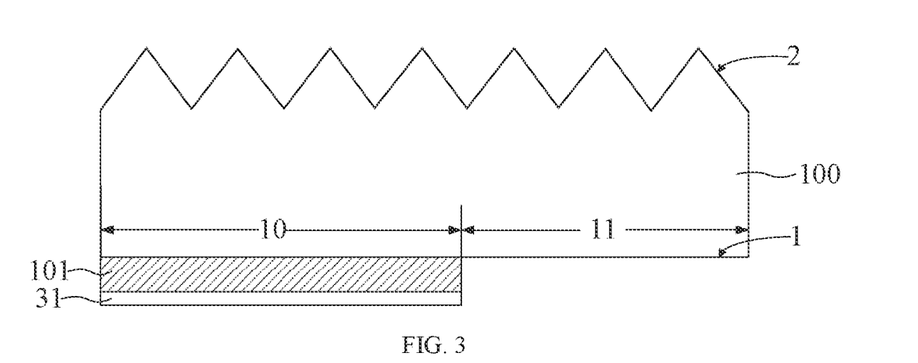
FIG. 3 is a cross-sectional view of a structure corresponding to steps of forming a first doping layer in the method for manufacturing a back-contact solar cell according to embodiments of the present disclosure.
Figure 4:
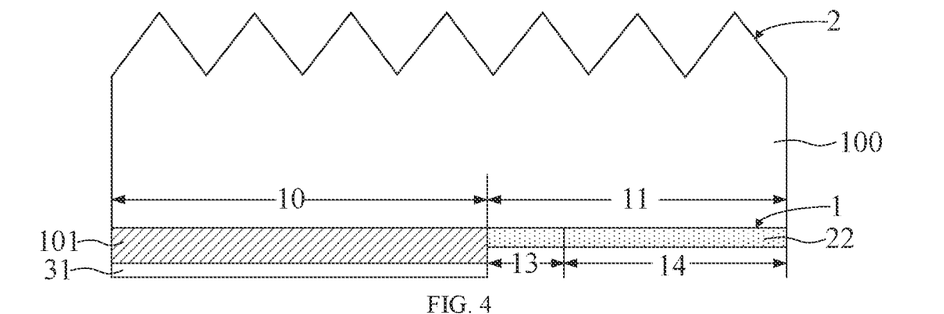
FIG. 4 is a cross-sectional view of a structure corresponding to steps of forming a second doping layer in a method for manufacturing a back-contact solar cell according to embodiments of the present disclosure.
Figure 5:
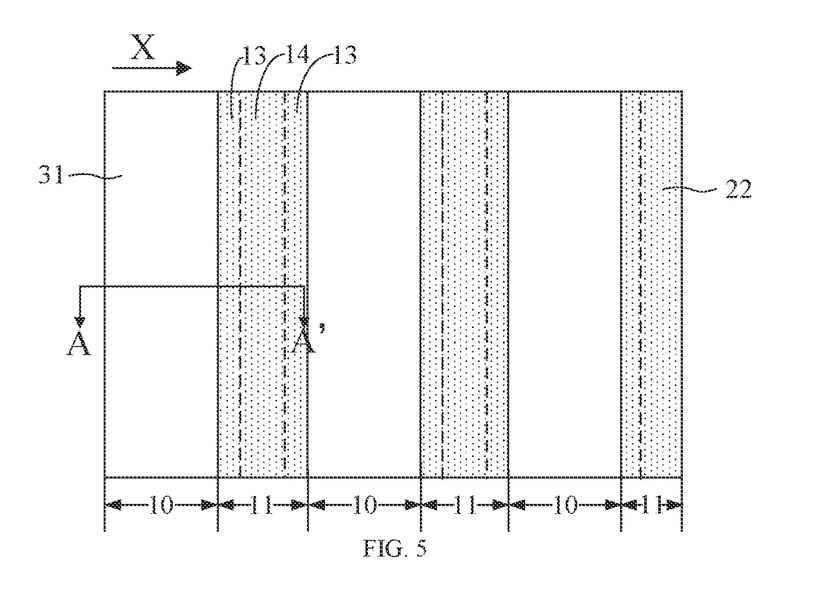
FIG. 5 is a top view of a structure corresponding to steps of forming a second doping layer in a method for manufacturing a back-contact solar cell according to embodiments of the present disclosure.

FIG. 1 is a schematic cross-sectional view of a structure corresponding to steps of providing an initial substrate in a method for manufacturing a back-contact solar cell according to embodiments of the present disclosure. FIG. 2 is a schematic cross-sectional view of a structure corresponding to steps of forming an initial first doping layer in a method for manufacturing a back-contact solar cell according to embodiments of the present disclosure. FIG. 3 is a cross-sectional view of a structure corresponding to steps of forming a first doping layer in the method for manufacturing a back-contact solar cell according to embodiments of the present disclosure. FIG. 4 is a cross-sectional view of a structure corresponding to steps of forming a second doping layer in a method for manufacturing a back-contact solar cell according to embodiments of the present disclosure. FIG. 5 is a top view of a structure corresponding to steps of forming a second doping layer in a method for manufacturing a back-contact solar cell according to embodiments of the present disclosure. FIG. 4 is a sectional view in an AA' direction of FIG. 5.

Referring to FIGS. 2 to 5, a substrate 100 is provided and has a first surface 1. The first surface 1 includes first regions 10 and second regions 11 that are alternatingly arranged in a preset direction X. A plurality of first doping layers 101 are formed over the first regions 10, where a respective first doping layer 101 is over a corresponding first region of the first regions 10. A plurality of second doping layers 22 are formed over the second regions 11, where a respective second doping layer 22 is over a corresponding second region of the second regions 11. A plurality of mask layers are formed, where a respective mask layer is formed over a surface of the respective first doping layer 101. A conductivity type of the first doping layer 101 is different from that of the second doping layer 22. The respective second doping layer 22 includes first portions 13 and at least one second portion 14 arranged in the preset direction X. The first portions 13 are located on two opposite sides of the second portion 14, and the first portion 13 is abutted on the respective first doping layer 101.

In some embodiments, the first surface 1 has two opposite edges and the preset direction X may be a direction from one edge of the two opposite edges to the other edge of the two opposite edges.

In some embodiments, there may be a plurality of first regions 10 and a plurality of second regions 11.

The substrate 100 is configured to receive incident light and generate photo-generated carriers. In some embodiments, the substrate 100 may be a semiconductor substrate.

In some embodiments, a material of the substrate 100 may be an elemental semiconductor material, and the elemental semiconductor material includes a single element, such as, silicon or germanium. The elemental semiconductor material may be a monocrystalline state, a polycrystalline state, an amorphous state, or a microcrystalline state (i.e., a state having both a monocrystalline state and an amorphous state). For example, silicon may be at least one of monocrystalline silicon, polycrystalline silicon, amorphous silicon, or microcrystalline silicon.

In some embodiments, the material of the substrate 100 may also be a compound semiconductor material. Common compound semiconductor materials include, but are not limited to, silicon germanium, silicon carbide, gallium arsenide, indium gallium, perovskite, cadmium telluride, copper indium selenium, and other materials.

The substrate 100 may be an N-type semiconductor substrate or a P-type semiconductor substrate. The N-type semiconductor substrate is doped with an N-type doping element, which can be any one of Group V elements, such as, phosphorus (P), bismuth (Bi), antimony (Sb), or arsenic (As). The P-type semiconductor substrate is doped with a P-type doping element, and the P-type doping element can be any one of Group III elements, such as, boron (B), aluminum (Al), gallium (Ga), or indium (In).

The substrate 100 has a first surface 1 and a second surface 2 opposite the first surface 1. In some embodiments, the back-contact solar cell is a single-sided cell, the second surface 2 of the substrate 100 may serve as a light receiving surface for receiving incident light, and the first surface 1 serves as a backlight surface.

In some embodiments, the back-contact solar cell is a double-sided cell, and both the second surface 2 and the first surface 1 of the substrate 100 can be used as light receiving surfaces, both of which can be used for receiving incident lights. It shall be understood that the backlight surface referred to in the embodiments of the present disclosure can also receive incident light, and just a proportion of incident light received by the backlight surface is less than a proportion of incident light received by the light receiving surface.

In some embodiments, a texturing process may be performed on at least one of the second surface 2 and the first surface 1 of the substrate 100 to form a texture surface on at least one of the second surface 2 or the first surface 1 of the substrate 100, so that the absorption utilization of incident light by the second surface 2 or the first surface 1 of the substrate 100 may be enhanced. In some embodiments, the texture surface may be a pyramidal texture surface, and the pyramidal texture surface is a common texture surface, which not only reduces the reflectivity of the surface of the substrate 100, but also forms light traps, thereby increasing the absorption effect of the substrate 100 to incident light and increasing the conversion efficiency of the solar cell.

Specifically, if the back-contact solar cell is a single-sided cell, a texture surface may be formed on the light receiving surface of the substrate 100, for example, a pyramidal texture surface. The backlight surface of the substrate 100 may be a polished surface, that is, the backlight surface of the substrate 100 is flatter than the light receiving surface. It is to be noted that for the single-side cell, the texture surface may be formed on both the light receiving surface and the backlight surface of the substrate 100.

If the back-contact solar cell is the double-sided cell, the texture surface may be formed on both the light receiving surface and the backlight surface of the substrate 100.

The second doping layers 22 are used for subsequent formation of target second doping layers. Since the plurality of first regions 10 and the plurality of second regions 11 are alternatingly arranged, and the second doping layers 22 are formed on the second regions 11 and the first doping layers 101 are formed on the first regions 10, there may be the plurality of second doping layers 22 and the first doping layers 101, and the second doping layers 22 and the first doping layers 101 are alternatingly arranged.

First doping layers 101 are arranged on the two opposite sides of the respective second doping layer 22 in the preset direction X. The respective second doping layer 22 includes the second portion 14 and the first portions 13 located on the two opposite sides of the second portion 14, and a respective first portion 13 is abutted on a side of a respective first doping layer 101. That is, the respective first portion 13 is interposed between the respective first doping layer 101 and the second portion 14, the second portion 14 is subsequently used to form the target second doping layer, and the first portions 13 are subsequently removed, so that the first doping layers 101 and the target second doping layers can be isolated.

The respective mask layer is formed over the surface of the respective first doping layer 101, which can avoid that a subsequent process etching of the first portions 13 may damage the first doping layer 101.

It shall be understood that, in the embodiments of the present disclosure, the respective second doping layer 22 is divided into the first portions 13 and the second portion 14 according to the different subsequent processing processes, which does not mean that the first portion 13 and the second portion 14 are two separate film layers. In fact, the second doping layer 22 is a continuous film layer.

In some embodiments, a ratio of a width of a respective first portion 13 to a width of a respective second portion 14 in the preset direction X is in a range of 0.09 to 2, for example, 0.09 to 0.1, 0.1 to 0.2, 0.2 to 0.5, 0.5 to 0.8, 0.8 to 0.9, 0.9 to 1, 1 to 1.2, 1.2 to 1.5, 1.5 to 1.9, or 1.9 to 2. The second portion 14 is subsequently used to form the target second doping layer, and the first portion 13 is subsequently removed, so that the first doping layer 101 and the target second doping layer can be isolated. The ratio of the width of the respective first portion 13 to the width of the respective second portion 14 being in the range of 0.09 to 2 means that a ratio of a width of a subsequently formed gap between the first doping layer 101 and the target second doping layer to a width of the target second doping layer is in a range of 0.09 to 2.

When the ratio of the width of the respective first portion 13 to the width of the respective second portion 14 is in the range of 0.09 to 1, for example, 0.09 to 0.1, 0.1 to 0.2, 0.2 to 0.5, 0.5 to 0.8, 0.8 to 0.9, or 0.9 to 1, the width of the gap between the first doping layer 101 and the target second doping layer is smaller than the width of the target second doping layer. Therefore, the width of the gap between the first doping layer 101 and the target second doping layer can be reduced, and a relatively wide target second doping layer can be formed, so that the target second doping layer can provide more carrier transmission channels, enhance the carrier transmission, improve the carrier collection ability of the back-contact solar cell, and further ensure that the back-contact solar cell has higher photoelectric conversion efficiency.

When the ratio of the width of the respective first portion 13 to the width of the respective second portion 14 is in the range of 1 to 2, for example, 1 to 1.2, 1.2 to 1.5, 1.5 to 1.9, or 1.9 to 2, the width of the gap between the first doping layer 101 and the target second doping layer is larger than the width of the target second doping layer, but not too large, which can ensure better isolation effect between the first doping layer 101 and the target second doping layer, and that the width of the formed target second doping layer is not too small, thereby ensuring that the carrier transport capacity in the target second doping layer is not weakened.

In some embodiments, the first doping layer 101 has a conductivity type different from a conductivity type of the substrate 100 and thus forms a P-N junction with the substrate 100. When the incident light irradiates the P-N junction, the P-N junction produces corresponding electron-hole pairs. Under the action of the barrier electric field of the P-N junction, the electron-hole pairs are separated, and the electrons are driven to move to the N region (P-type doping region) and the holes are driven to move to the P region (N-type doping region), resulting in a photo-generated electric field. Therefore, an electromotive force is generated between the N region and the P region, and a photocurrent is output.

The second doping layer 22 has a conductivity type same as the conductivity type of the substrate 100, and doping element concentration of the second doping layer 22 is greater than doping element concentration of the substrate 100, which can form a high-low junction structure. A built-in electric field from the target second doping layer to the interior the substrate 100 is formed in the high-low junction structure. Under the action of the built-in electric field, minority carriers make drift movement to make minority carriers escape from the interface and reduce the recombination rate of carriers at the interface of the substrate 100, thereby enhancing the open-circuit voltage, short-circuit current, and filling factor of the back-contact solar cell and improving the photoelectric conversion efficiency of the back-contact solar cell.

In some embodiments, the substrate 100 may be an N-type substrate 100, and the first doping layer 101 may be doped with a P-type doping element, which may be any one of a Group III element, such as boron (B), aluminum (Al), gallium (Ga), or indium (In). The second doping layer 22 may be doped with an N-type doping element, and the N-type doping element may be any one of a Group V element, such as phosphorus (P), bismuth (Bi), antimony (Sb), or arsenic (As).

In some embodiments, the substrate 100 may also be a P-type substrate 100, the first doping layer 101 may be doped with an N-type doping element and the second doping layer 22 may be doped with a P-type doping element.

In some embodiments, the first doping layers 101 are formed as follows. An initial substrate 20 is provided with reference to FIG. 1.

Referring to FIG. 2, a diffusion process is performed on the initial substrate 20 to diffuse a first doping element from one surface of the initial substrate 20 into a substrate 100 of a partial thickness to form an initial first doping layer 21. A remaining portion of the initial substrate which is not doped with the first doping element forms the substrate 100, and an interface between the substrate 100 and the initial first doping layer 21 may serve as the first surface 1.

In some embodiments, the initial substrate 20 is a silicon substrate. In the diffusion process, a first glass layer 31 is formed on a surface of the initial first doping layer 21. The first glass layer 31 includes a first doping element, and silicon and oxygen elements.

A conductivity type of the first doping element is different from a conductivity type of a doping element within the initial substrate 20.

In one particular example, the initial substrate 20 is an N-type silicon substrate and the first doping element may be boron. The initial substrate 20 can be placed in a diffusion furnace, and a boron diffusion process can be carried out at a temperature of 800° C. to 1200° C. for a duration of 2 h to 5 h to form the initial first doping layer 21. In the diffusion process, the silicon element in the initial substrate 20 reacts with the boron element and oxygen in the diffusion furnace to form the first glass layer 31, specifically a borosilicate glass layer, on the surface of the initial first doping layer 21. The borosilicate glass layer includes boron trioxide and silicon dioxide.

In some embodiments, the initial first doping layer 21 may have a thickness in a range of 0.7 μm to 1.3 μm, and the first glass layer 31 may have a thickness in a range of 100 nm to 200 nm.

The initial first doping layer 21 and the first glass layer 31 are formed on the first regions 10 and the second regions 11 of the first surface 1. Referring to FIG. 3, after the initial first doping layer 21 is formed, a part of the initial first doping layer 21 (refer to FIG. 2) and a part of the first glass layer 31 on the second regions 11 may be removed by an etching process, and a remaining portion of the initial first doping layer on the first regions 10 form the first doping layers 101.

In some embodiments, the part of the initial first doping layer 21 and the part of the first glass layer 31 on the second regions 11 may be removed using a laser process. A laser power used in the laser process may be 10 W to 40 W, for example, 10 W, 15 W, 20 W, 25 W, 30 W, 35 W or 40 W. When the laser power is within this power range, it is ensured that the laser used in the laser process is sufficient to remove the part of the initial first doping layer 21 and the part of the first glass layer 31 on the second regions 11 without causing excessive process damage to the substrate 100.

The laser used in the laser process can be any one of infrared laser, green laser, and ultraviolet laser, and the laser used in the laser processing can be any one of $CO_2$ laser, excimer laser, Ti: sapphire laser, and semiconductor laser. There is no restriction on the type of the laser.

In some embodiments, after the part of initial first doping layer 21 and the part of the first glass layer 31 on the second regions 11 are removed by laser process, in order to reduce/remove laser damage of the second regions 11, the second regions 11 may be soaked in NaOH solution with a mass concentration of 1%-5% for a duration of 400 s to 800 s.

Referring to FIGS. 4 to 5, in some embodiments, after the formation of the first doping layers 101, the second doping layers 22 are formed. In FIG. 5, dashed lines are used to illustrate first portions 13 and second portion 14 of the respective second doping layer 22. The respective first doping layer 101 is doped with the first doping element. The method for forming the second doping layers 22 includes: forming second layers on the second regions 11, where a respective second layer is formed over a corresponding second region of the second regions 11, and there is no any doping element doped in the second layers.

After the second layers are formed, the second layers are subjected to a diffusion process to implant a second doping element with a conductivity type different from that of the first doping element into the second layers, such that the second layers become the second doping layers 22.

In a specific example, if the first doping element is a P-type element, the second doping element may be a phosphorus element. The diffusion process for the second layers may be a phosphorus diffusion process for the second layers. The phosphorus diffusion process may include performing phosphorus diffusion on the second layers in the diffusion furnace.

Figure 6:
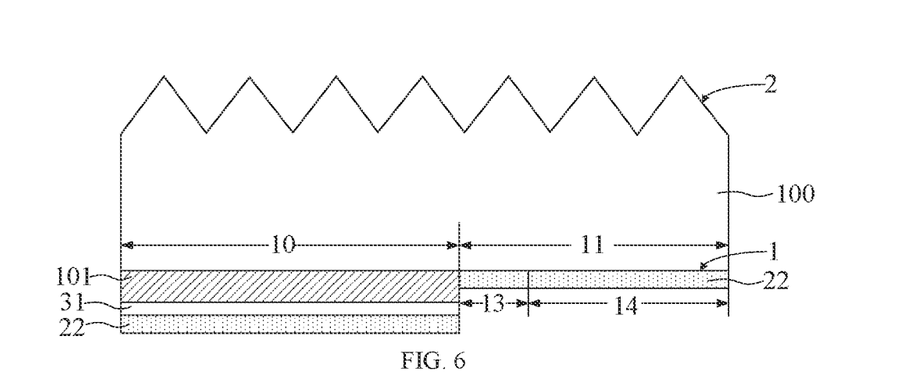
FIG. 6 is a cross-sectional view of a structure corresponding to steps of forming a second doping layer in a method for manufacturing a back-contact solar cell according to other embodiments of the present disclosure.

FIG. 6 is a cross-sectional view of a structure corresponding to the steps of forming the initial second doping in a method for manufacturing a back-contact solar cell according to other embodiments of the present disclosure.

Referring to FIG. 6, in some embodiments, there are second doping layers 22 further formed over the first doping layers 101, such that the second doping layers 22 formed over the first doping layers 101 constitutes mask layers. Specifically, a respective second doping layer 22 over the respective first doping layer 101 is in contact with part of the first glass layer 31 on the surface of the respective first doping layer 101 and may serve as the mask layer together with the part of the first glass layer 31.

Since the respective part of the first glass layer 31 is on the surface of the respective first doping layer 101, the first glass layer 31 can serve as the mask layer to prevent the second layers from directly contacting the first doping layers 101 during forming of the second layers. Therefore, there are second layers formed on the surface of the first glass layer 31 over the first regions 10 during forming of the second layers on the second regions 11. That is, the first glass layer 31 on the first doping layers 101 is not removed before the second layers are formed.

In the subsequent process of diffusing the second layers, the diffusion process is performed on the second layers over the first regions 10 and the second regions 11, so that there is the respective second doping layer 22 formed over the surface of the respective first doping layer 101, and the respective second doping layer 22 formed over the surface of the respective first doping layer 101 is used as the mask layer to protect the first doping layers 101 and prevent the first doping layers 101 from being damaged in the subsequent etching process. Moreover, the process of forming an additional mask layer can be omitted, such that the process can be simplified.

It is to be noted that in the embodiments of the present disclosure, the respective second doping layer 22 over the corresponding second region 11 is divided into the first portions 13 and a second portion 14, and the second doping layers on the first regions 10 are used as the mask layers.

Figure 7:
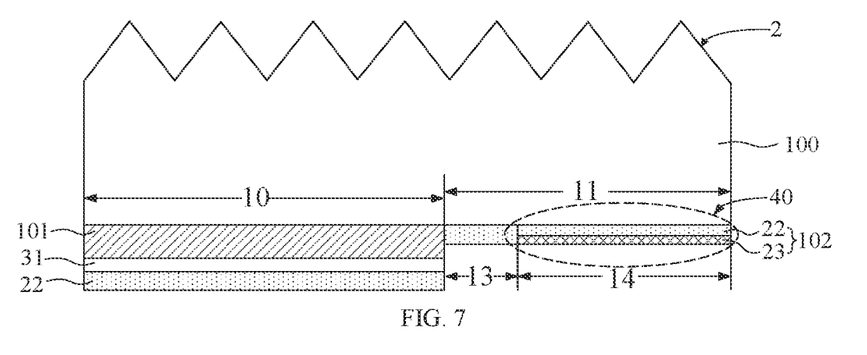
FIG. 7 is a cross-sectional view of a structure corresponding to steps of forming a target second doping layer in the method for manufacturing a back-contact solar cell according to embodiments of the present disclosure.
Figure 8:
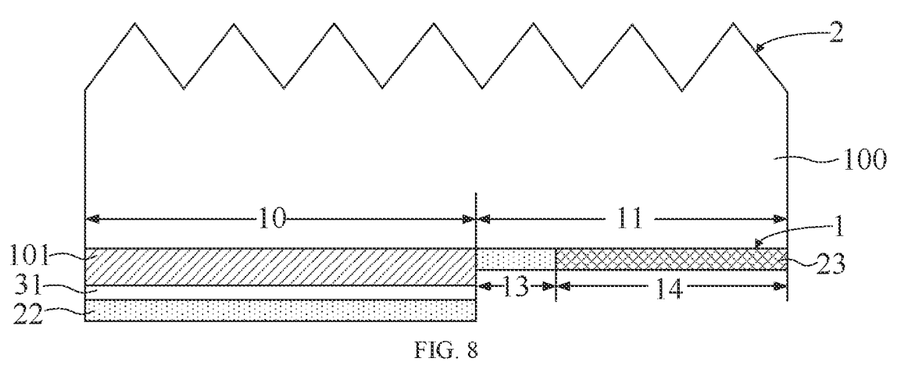
FIG. 8 is a cross-sectional view of a structure corresponding to steps of forming a target second doping layer in a method for manufacturing a back-contact solar cell according to other embodiments of the present disclosure.

FIG. 7 is a cross-sectional view of a structure corresponding to steps of forming a target second doping layer in the method for manufacturing a back-contact solar cell according to embodiments of the present disclosure. FIG. 8 is a cross-sectional view of a structure corresponding to steps of forming a target second doping layer in a method for manufacturing a back-contact solar cell according to other embodiments of the present disclosure.

Figure 11:
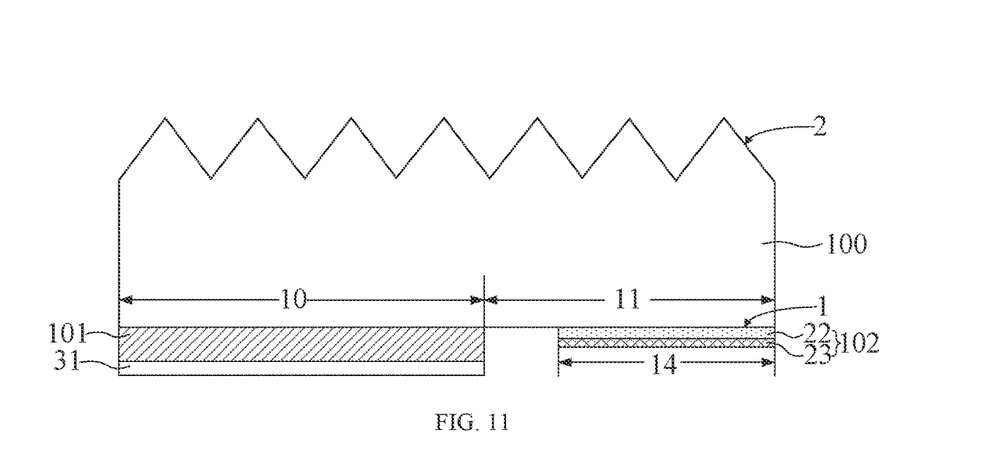
FIG. 11 is a cross-sectional view of a structure corresponding to steps of removing a first portion in a method for manufacturing a back-contact solar cell according to embodiments of the present disclosure.
Figure 12:
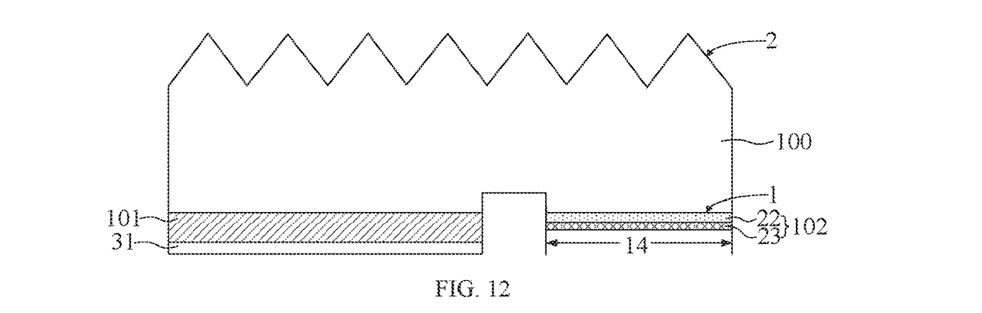
FIG. 12 is a cross-sectional view of a structure corresponding to the steps of removing the first portion in a method for manufacturing a back-contact solar cell according to embodiments of the present disclosure.

Referring to FIGS. 7 to 8, after the second doping layers 22 are formed, the second portions 14 of the second doping layers 22 over the second regions 11 are subjected to laser modification treatment to convert the second portions 14 into the target second doping layers 102. Referring to FIGS. 11 to 12, the first portions 13 and the target second doping layers 102 are etched to remove the first portions 13, and an etching rate at which the target second doping layers 102 are etched is lower than an etching rate at which the first portions 13 are etched in the etching process. The mask layers are removed.

The etching rate at which the target second doping layers 102 are etched in the etching process is lower than the etching rate at which the first portions 13 that have not been subjected to laser modification treatment are etched. Therefore, by using an etching selectivity ratio, the first portions 13 between the target second doping layers 102 and the first doping layers 101 can be removed and the target second doping layers 102 that has been subjected to laser modification treatment can be retained. In this way, merely one step of laser modification treatment can be performed, to realize patterning without steps of multi-step mask or printing, which may greatly simplify the process. In addition, the photoelectric conversion performance of the back-contact solar cell can be avoided to be affected due to process damage of the target second doping layers 102 caused by a complex patterning process.

Referring to FIGS. 7 to 8, in some embodiments, the laser modification treatment is performed on the second portions 14 to form the target second doping layers 102 as follows. The laser modification treatment is performed on the second portions 14 from the surface of the respective second portion 14 to convert at least a partial thickness of the respective second portion 14 into a modified layer 23, and then the modified layer 23 and the remaining portion of the respective second portion 14 form the target second doping layer 102. The etching rate at which the modified layers 23 is etched is less than the etching rate at which the first portions 13 are etched in the etching process.

During the etching process, an etching selectivity ratio of the modified layers 23 to the first portions 13 is used, so that the modified layers 23 obtained after the laser modification treatment can act as the mask layers. When the first portions 13 are removed by the etching process, the modified layers 23 are less or not etched. In this way, the target second doping layers 102 can function as the mask, and no additional mask needs to be formed on the surface of the respective target second doping layer 102 before the etching process, and no cleaning process is required to be performed on the surface of the target second doping layer 102 after the etching process, thereby greatly simplifying the process flow.

Referring to FIG. 7, in one example, the partial thickness of the second portion 14 of the respective second doping layer 22 is converted into the modified layer 23 by the laser modification treatment, and the remaining portion of the second portion 14 of the respective second doping layer 22 and the modified layer 23 constitute the target second doping layer 102, so that the remaining portion of the respective second portion 14 can retain the better performance of the second doping layer 22 and ensure the carrier transport capacity, and the modified layer 23 can also provide a carrier transport channel and play a better mask effect.

In some embodiments, by using the laser modification treatment, the partial thickness of the second portion 14 of the respective second doping layer 22 can be converted into the modified layer 23. In the etching process, the first portions 13 and the modified layers 23 are removed. That is, in the etching process, all the modified layers 23 are removed.

In some embodiments, by using the laser modification treatment, the partial thickness of the second portion 14 of the respective second doping layer 22 can be converted into the modified layer 23. In the etching process, the first portions 13 and at most part of the respective modified layer 23 are removed. That is, in the etching process, part of the respective modified layer 23 is removed or no modified layer 23 is removed.

That is, the partial thickness of the second portion 14 of the respective second doping layer 22 is converted into the modified layer 23, and in the etching process, the entire modified layer 23 may be removed, or a portion of the modified layer 23 may be removed, or the modified layer 23 may not be etched. Therefore, the range of parameter adjustment of the etching process can be broadened, and the flexibility of the etching process can be improved.

Referring to FIG. 8, in another example, by using the laser modification treatment, the entire second portion 14 of the respective second doping layer 22 can be converted into the modified layer 23, so that the entire target second doping layer is difficult to be etched in the etching process, thereby ensuring that the target second doping layers are retained after the first portions 13 are removed.

In some embodiments, the material of the second doping layer 22 includes polysilicon. That is, the materials of the first portions 13 and the second portion 14 include polysilicon. If only part of the second portion 14 of the respective second doping layer 22 is converted into the modified layer 23 by the laser modification treatment, the remaining part of the target second doping layer 102 formed later except the modified layer 23 is doped polysilicon.

In polysilicon, silicon atoms are arranged into many nuclei in the form of diamond lattice, which grow into grains with different crystallographic orientations, and these grains are combined to crystallize into polysilicon. That is, the polysilicon is formed by combining multiple grains, and a contact interface between grains with the same structure and different orientations becomes a grain boundary.

There are more grains in the polysilicon, so there are more grain boundaries. Grain boundaries can be used as diffusion channels of doping elements. The more grain boundaries, the more diffusion of the doping elements. Due to the existence of polysilicon in the target second doping layer 102, the concentration of doping elements in the target second doping layer 102 is higher, and then the concentration of the doping elements in the target second doping layer 102 is greater than that of the doping elements of the substrate 100, thus forming a high-low junction and improving the carrier transmission capacity.

In some embodiments, the material of the second doping layer 22 includes polysilicon, and the second doping layer 22 may be formed as follows. A polysilicon layer is formed on the second regions 11, and may be an intrinsic polysilicon layer. In some embodiments, the polysilicon layer is further formed on the surface of the first glass layer 31 on the first regions 10. That is, the subsequently formed second doping layers 22 can also be formed on the first glass layers 31 on the first regions 10 as the mask layers.

After the formation of the polysilicon layer, the polysilicon layer is subjected to the diffusion process to implant a second doping element having a conductivity type different from a conductivity type of the first doping element into the polysilicon layer, such that the polysilicon layer becomes the second doping layers 22.

In some embodiments, the diffusion process may include: depositing a doping source on the top surface of the polysilicon layer, the doping source including the second doping element; and introducing oxygen into a diffusion furnace during depositing of the doping source, and diffusing at a temperature of 700° C. to 1000° C. for a duration of 1 h to 3 h to form the second doping layers 22.

Figure 9:
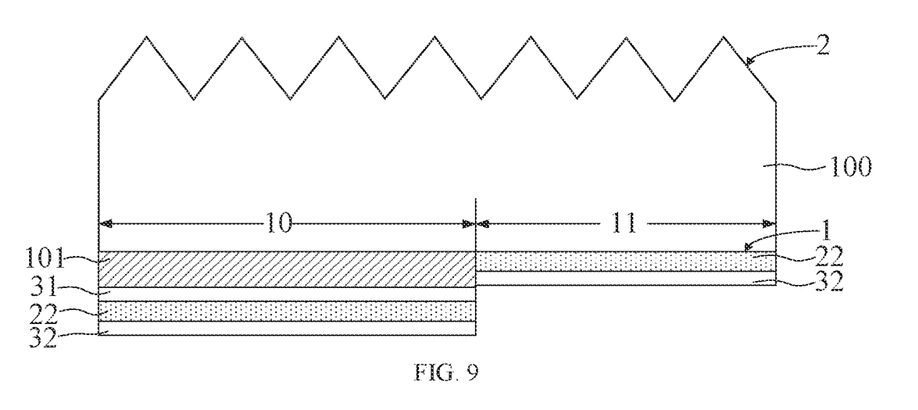
FIG. 9 is a cross-sectional view of a structure corresponding to the steps of forming a second glass layer in a method for manufacturing a back-contact solar cell according to other embodiments of the present disclosure.

FIG. 9 is a cross-sectional view of a structure corresponding to the steps of forming a second glass layer in a method for manufacturing a back-contact solar cell according to other embodiments of the present disclosure.

Referring to FIG. 9, during depositing of the doping source, oxygen reacts with the second doping element and the silicon elements to form a second glass layer 32 over the second doping layers 22 that are formed over the first doping layers and the second doping layers that are formed over the second regions. If the second doping element is phosphorus element, the second glass layer 32 may be a phosphorus-silicon glass layer.

In some embodiments, the second doping layer 22 may have a thickness of 100 nm to 300 nm.

In some embodiments, the second glass layer 32 may have a thickness of 20 nm to 100 nm.

Referring to FIG. 9, in some embodiments, the polysilicon layer is further formed on the first glass layers 31 on the first regions 10. In the diffusion process of the polysilicon layer, the polysilicon layer on the first regions 10 and the second regions 11 is simultaneously diffused. The second doping layers 22 are formed on the first regions 10 and the second regions 11, and the second glass layer 32 is formed on the second doping layers 22 on the first regions 10 and the second regions 11.

In some embodiments, the second glass layer 32 on the second doping layers 22 need to be removed prior to performing the laser modification treatment on the second portions 14. The problem that the degree of modification of the second portions 14 by the laser modification treatment is too weak due to the presence of the second glass layer 32 is prevented.

In some embodiments, the second glass layer 32 may be removed by using a pickling process, for example, the second glass layer 32 may be cleaned by using a hydrofluoric acid solution with a mass concentration of 1% to 20% for a duration of 5 s to 60 s.

In some embodiments, the material of the second doping layers 22 includes polysilicon, and the material of the modified layers 23 includes amorphous silicon. That is, the laser modification treatment is used for converting at least part of the second portion 14 from polysilicon to amorphous silicon.

Since the material of the first portions 13 is polysilicon and the material of the modified layer 23 is amorphous silicon, etching rates at which the first portions 13 and the modified layer 23 are etched can be different by using the difference between the polysilicon and amorphous silicon. The first portions 13 and the target second doping layer 102 can be etched by an etching process having a higher etching rate for polysilicon and a lower etching rate for amorphous silicon, so that the target second doping layer 102 may not be completely removed when the first portions 13 are removed.

During the laser modification treatment, the second portions 14 may be irradiated with a laser beam from the surface of the respective second portion 14, and the laser beam passes through the second portion 14 of at least partial thickness to melt and recrystallize the polysilicon. Under the action of laser beam, the ordered crystal planes in polysilicon become disordered crystal planes, and the distribution of silicon atoms is disordered, resulting in many defects, causing a large number of hanging bonds and holes, and resulting in the transformation of polysilicon into amorphous silicon.

In some embodiments, a laser power of the laser beam used in the laser modification treatment is 5 W to 40 W, for example, 5 W to 10 W, 10 W to 15 W, 15 W to 20 W, 20 W to 25 W, 25 W to 30 W, 30 W to 35 W, or 35 W to 40 W. When the laser power of the laser beam is within the above range, the laser power of the laser modification treatment is sufficiently large, to enable that the power of the laser beam emitted is sufficient to convert the polysilicon into amorphous silicon. In addition, the thickness of the formed modified layer 23 can be controlled by adjusting the power of the laser process within the above laser power range. For example, the entire second portions 14 can be converted into the modified layers 23 by adjusting the power of the laser process to a higher level, and only the second portion 14 with a partial thickness can be converted into the modified layer 23 by adjusting the power of the laser process to a lower level.

In the above range, the laser power of the laser modification treatment is not too large, which can prevent the second portion 14 being removed caused by the laser due to the excessive laser power.

In some embodiments, the laser used in the laser modification treatment may be any one of an infrared laser, a green laser, and an ultraviolet laser. The laser used in the laser process may be any one of a $CO_2$ laser, an excimer laser, a Ti:sapphire laser, and a semiconductor laser. There is no restriction on the type of the Referring to FIG. 10, which is an enlarged schematic view of a structure at a dashed box 40 in FIG. 7, in some embodiments, each modified layer 23 may include an amorphous silicon layer 231 and a silicon oxide layer 232 that are stacked sequentially in a direction away from the substrate 100. The silicon oxide layer 232 is etched at an etching rate lower than an etching rate of the first portions 13 during the etching process, and the amorphous silicon layer 231 is etched at an etching rate lower than an etching rate of the first portions 13 during the etching process. In addition, in the etching process, the silicon oxide layer 232 is removed.

Figure 10:
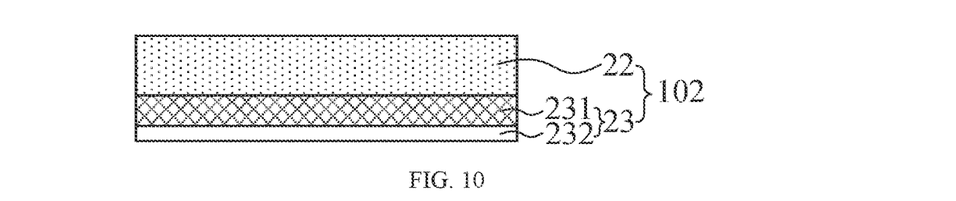
FIG. 10 is an enlarged schematic view of a structure at a dashed box in FIG. 7.

The laser modification treatment is used for converting at least part of the second portion 14 from polysilicon to amorphous silicon, thereby forming the amorphous silicon layer 231. The silicon element of the amorphous silicon layer 231 reacts with the oxygen element in the air under the thermal effect generated by the laser process, and then the silicon oxide layer 232 is formed on the surface of the amorphous silicon layer 231.

In the etching process, merely the silicon oxide layer 232 and the first portions 13 may be removed and the amorphous silicon layer 231 is retained. Since the number of grain boundaries of the amorphous silicon layer 231 is smaller than that of the polysilicon layer 231, and the density of the amorphous silicon layer 231 is high, it is difficult for the paste to penetrate the amorphous silicon layer 231 in the subsequent forming electrodes using the sintering process, thereby preventing the electrodes from burning through the target second doping layers 102 and contacting the substrate 100.

FIG. 11 is a cross-sectional view of a structure corresponding to steps of removing a first portion in a method for manufacturing a back-contact solar cell according to embodiments of the present disclosure. FIG. 12 is a cross-sectional view of a structure corresponding to the steps of removing the first portion in a method for manufacturing a back-contact solar cell according to embodiments of the present disclosure.

Referring to FIGS. 11 to 12, after forming the target second doping layers, the etching process is performed to remove the first portions.

In some embodiments, the etching process is an alkali etching process. The etching rate at which the amorphous silicon is etched by alkali solution is less than an etching rate at which the polysilicon is etched, so that the first portions 13 including polysilicon are more easily removed in the alkali etching process.

In other embodiments, the etching process may be any other processes, in which an etching rate at which amorphous silicon is etched is less than the etching rate at which the polysilicon is etched.

In some embodiments, process parameters for the alkali etching process includes: an etching liquid being a NaOH solution with a mass concentration of 0.5% to 5%, for example, the mass concentration of 0.5% to 1%, 1% to 1.5%, 1.5% to 2%, 2% to 3%, 3% to 4.5%, 4.5% to 4.9%, or 4.9% to 5%. The temperature of the etching liquid is in a range of 60° C.~80° C., for example, 60° C.~65° C., 65° C.~68° C., 68° C.~70° C., 70° C.~75° C., 75° C.~79° C., or 79° C.~80° C. The process duration is in a range of 240 s~500 s, for example, 240 s~250 s, 250 s~300 s, 300 s~320 s, 320 s~350 s, 350 s~380 s, 380 s~410 s, 410 s~450 s, 450 s~480 s, or 480 s~500 s. When the above process parameter for the alkali etching process is within the above range, the target second doping layers 102 are retained and the first portions 13 are removed by the alkali etching process, so that the target second doping layers 102 are spaced from the first doping layers 101.

In some embodiments, referring to FIG. 11, during the etching process, the first portions 13 and the target second doping layers 102 are etched until the first portions 13 are removed, i.e., the first portions 13 are removed without etching part of the substrate 100 facing the first portions 13.

Referring to FIG. 12, in some embodiments, the first portions 13 and a partial thickness of the substrate 100 directly facing the first portions 13 are removed in the etching process. That is, in the etching process, after the first portions 13 are removed, the first surface 1 is exposed, and the first surface 1 is continued to be etched to remove the partial thickness of the substrate 100, so that the first doping layers 101 are separated from the target second doping layers 102 by the gaps. In other words, during the etching process, the partial thickness of the substrate 100 facing the first portions 13 is removed, which can ensure that the first portions 13 are completely removed and improves the reliability of the formed gaps.

In some embodiments, the partial thickness of the substrate 100 removed during the etching process may be 1 μm to 6 μm, for example, 1 μm to 2 μm, 2 μm to 3 μm, 3 μm to 4 μm, 4 μm to 5 μm, 5 μm to 5.5 μm, or 5.5 μm to 6 μm.

In the etching process, the first doping layers 101 may be protected by the mask layers, so that the etching process does not cause damage to the first doping layers 101.

In some embodiments, the second doping layers formed on the first glass layers 31 on the first regions 10 serve as the mask layers, and the second doping layers 22 on the first glass layers 31 can also be removed in the etching process.

It shall be understood that since the laser modification treatment is merely performed on the second portions 14, the material of the second doping layers 22 on the first glass layers 31 is the same as that of the first portions 13, for example, the material of the second doping layers 22 on the first glass layers 31 is polysilicon. During the etching process, the second doping layers 22 on the first glass layers 31 and the first glass layers 31 together serve as the mask layers for the first doping layers 101, to protect the first doping layers 101. Moreover, in the etching process, the second doping layers 22 on the first glass layers 31 are gradually etched away, which can not only omit the subsequent process of removing the mask layers alone, but also avoid the exposure of the first doping layers 101 in the etching process. At the end of the etching process, the second doping layers 22 on the first glass layers 31 are completely etched. In this case, even if the first glass layers 31 are etched in the etching process and the first doping layers 101 are exposed, the first doping layers 101 are not etched since the etching process has ended. It is to be noted that since the second doping layers 22 on the first glass layers 31 are formed in a same step as the first portions 13, a thickness of the respective second doping layer 22 of the second doping layers 22 on the first glass layers 31 is the same as the thickness of the first portions 13. In the same etching process, when the first portions 13 are removed, the second doping layers 22 on the first glass layers 31 may be inevitably removed, thereby ensuring that the second doping layers 22 on the first glass layers 31 are removed cleanly.

In some embodiments, if the first glass layers 31 are not etched after the etching process, a pickling process is performed on the first glass layers 31 to remove the first glass layers 31. For example, the first glass layers 31 are cleaned with a hydrofluoric acid solution to remove the first glass layers 31.

Figure 13:
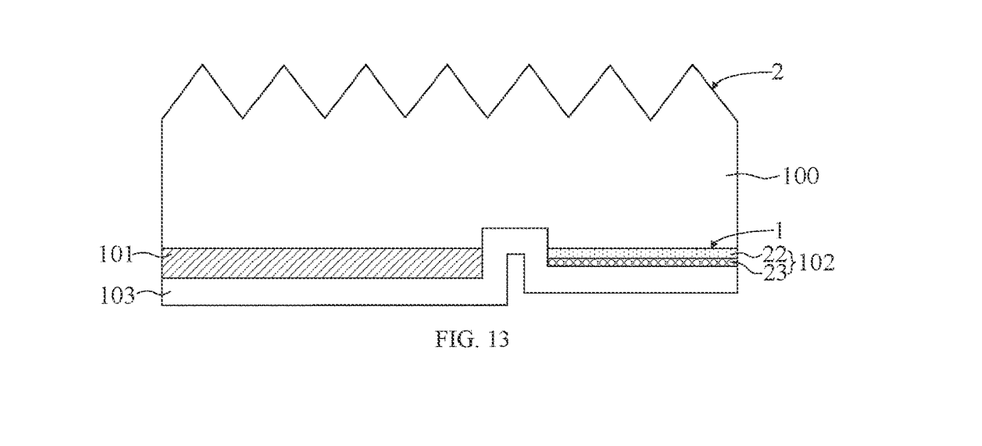
FIG. 13 is a cross-sectional view of a structure corresponding to steps of forming a first passivation layer in a method for manufacturing a back-contact solar cell according to embodiments of the present disclosure.

FIG. 13 is a cross-sectional view of a structure corresponding to steps of forming a first passivation layer in a method for manufacturing a back-contact solar cell according to embodiments of the present disclosure.

Referring to FIG. 13, in some embodiments, the method further includes the following. A first passivation layer 103 is formed, where the first passivation layer 103 is disposed over the first doping layers 101 and the target second doping layers 102, and the first passivation layer 103 further fills gaps between the first doping layer 101 and the target second doping layer 102.

Specifically, the first passivation layer 103 may fill the gaps between the first doping layers 101 and the target second doping layers 102 and cover a surface of a part of the substrate 100 between the first doping layers 101 and the target second doping layers 102. The first passivation layer 103 can have a good passivation effect on the surface of the substrate 100, reduce the density of defect states on the surface of the substrate 100, better suppress carrier recombination on the surface of the substrate 100, and has an antireflection effect. In addition, the first passivation layer 103 can enable that the first doping layers 101 are isolated from the target second doping layers 102.

In some embodiments, the first passivation layer 103 may be a single-layer structure. In other embodiments, the first passivation layer 103 may also be a multi-layer structure. In some embodiments, a material of the first passivation layer 103 may be at least one of silicon oxide, alumina silicon, silicon nitride or silicon oxynitride.

In some embodiments, the first passivation layer 103 is formed as follows. The first passivation layer 103 is formed on the first doping layers 101 and the target second doping layers 102, and on gaps between the first doping layers 101 and the target second doping layers 102 by using a plasma enhanced chemical vapor deposition (PECVD) method.

In some embodiments, the gaps between the first doping layers 101 and the target second doping layers 102 may also be filled with isolation materials to form isolation structures. The first passivation layer may cover a surface of the respective first doping layer 101 away from the substrate 100, a surface of the respective target second doping layer 102 away from the substrate 100, and a surface of the isolation structure. The material of the isolation structure can be an insulating material, such as, silicon oxide.

Figure 14:
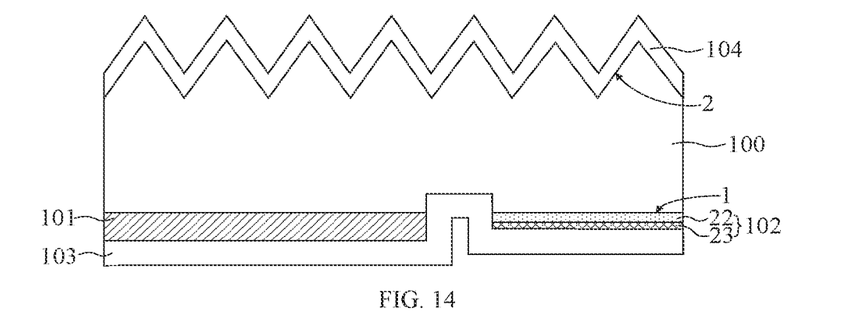
FIG. 14 is a cross-sectional view of a structure corresponding to steps of forming a second passivation layer in a method for manufacturing a back-contact solar cell according to embodiments of the present disclosure.

FIG. 14 is a cross-sectional view of a structure corresponding to steps of forming a second passivation layer in a method for manufacturing a back-contact solar cell according to embodiments of the present disclosure.

Referring to FIG. 14, in some embodiments, the method for manufacturing the back-contact solar cell may further include the following. A second passivation layer 104 is formed on the second surface 2.

The second passivation layer 104 can, on the one hand, have a good passivation effect on the second surface 2, reduce the density of defect states of the second surface 2, and better inhibit the carrier recombination of the second surface 2, and on the other hand, can have an anti-reflection effect.

In some embodiments, the second passivation layer 104 may be a single-layer structure. In other embodiments, the second passivation layer 104 may also be a multi-layer structure. In some embodiments, a material of the second passivation layer 104 may be at least one of silicon oxide, aluminum oxide, silicon nitride, and silicon oxynitride.

In some embodiments, the second passivation layer 104 may be formed using a PECVD method.

In some embodiments, the step of forming the second passivation layer 104 may be performed prior to the formation of the initial first doping layer 21. In some embodiments, the step of forming the second passivation layer 104 may also be performed after the formation of the first doping layer 101 and the target second doping layer 102.

Figure 15:
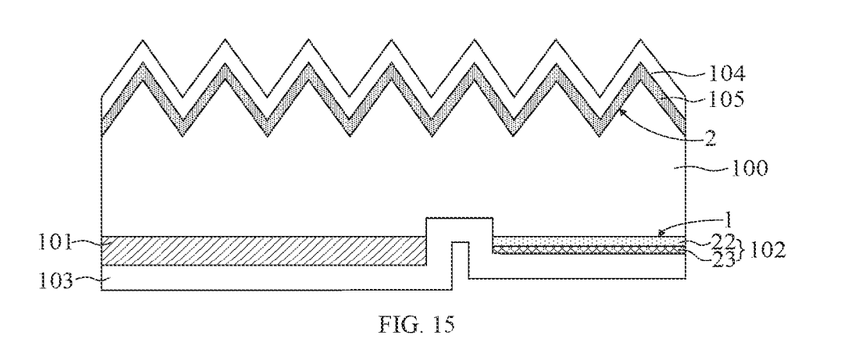
FIG. 15 is a cross-sectional view of a structure corresponding to steps of forming a front surface field in a method for manufacturing a back-contact solar cell according to embodiments of the present disclosure.

FIG. 15 is a cross-sectional view of a structure corresponding to steps of forming a front surface field in a method for manufacturing a back-contact solar cell according to embodiments of the present disclosure.

Referring to FIG. 15, in some embodiments, prior to forming the second passivation layer 104, a doping process may also be performed on the second surface 2 to dope a doping element having the same conductivity type as the substrate 100 into a portion of the substrate 100 to form a front surface field 105. Doping element concentration of the front surface field 105 is greater than that of the substrate 100, which can effectively prevent minority carriers from moving to the vicinity of the second surface 2 with higher defect density and reduce the recombination probability of the minority carriers.

Figure 16:
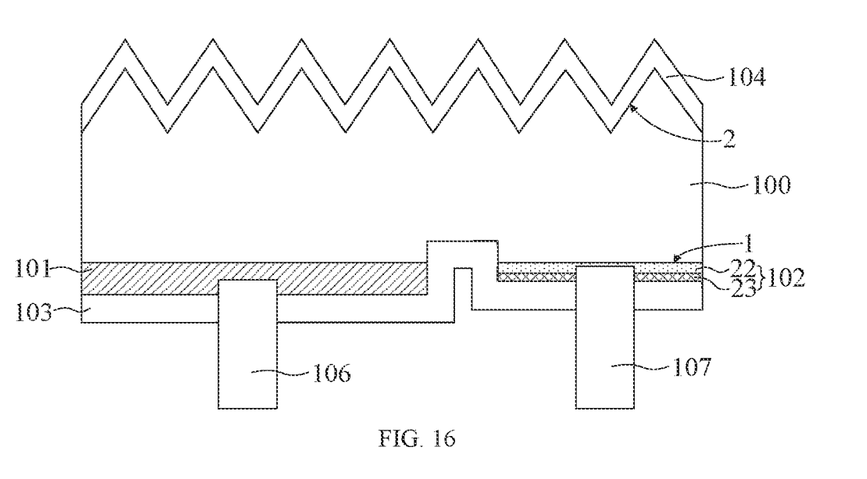
FIG. 16 is a cross-sectional view of a structure corresponding to steps of forming first electrodes and second electrodes in a method for manufacturing a back-contact solar cell according to embodiments of the present disclosure.

FIG. 16 is a cross-sectional view of a structure corresponding to steps of forming first electrodes and second electrodes in a method for manufacturing a back-contact solar cell according to embodiments of the present disclosure.

Referring to FIG. 16, in some embodiments, after the formation of the first passivation layer 103 and the second passivation layer 104, the method further includes forming first electrodes 106 and second electrodes 107.

The first electrodes 106 and the second electrodes 107 are alternatingly arranged in the preset direction X, the first electrode 106 penetrate the first passivation layer 103 to be in electrical contact with the first doping layers 101, and the second electrodes 107 penetrate the first passivation layer 103 to be in electrical contact with the target second doping layers 102.

In some embodiments, the first electrodes 106 and the second electrodes 107 may be formed using a printing process and a sintering process.

For example, the conductive paste is coated on a surface of a part of the first passivation layer 103 facing the first doping layers 101 and the target second doping layers 102 by using a screen-printing process, and is sintered so that the conductive paste penetrates the first passivation layer 103 and is electrically contacted with the first doping layer 101 and the target second doping layer 102, respectively.

In the method for manufacturing the back-contact solar cell provided in the above-described embodiments, the second portions 14 of the second doping layers 22 are subjected to laser modification treatment to form the target second doping layers 102. The etching rate for the target second doping layers 102 during the etching process is less than the etching rate for the first portions 13 without being subjected to the laser modification treatment. Using the etching selectivity ratio, the target second doping layers 102 which have been subjected to the laser modification treatment are retained when the first portions 13 between the target second doping layers 102 and the first doping layers 101 are removed. In the above steps, there is no need to go through multi-step mask or printing steps to realize patterning, which greatly simplifies the process flow. In addition, the problem that the photoelectric conversion performance of the back-contact solar cell itself is damaged due to process damage to the target second doping layers 102 caused by a complex patterning process can be prevented.

Correspondingly, embodiments of the disclosure further provide a back-contact solar cell, which is prepared by adopting the method for manufacturing the back-contact solar cell provided in the embodiments.

Figure 17:
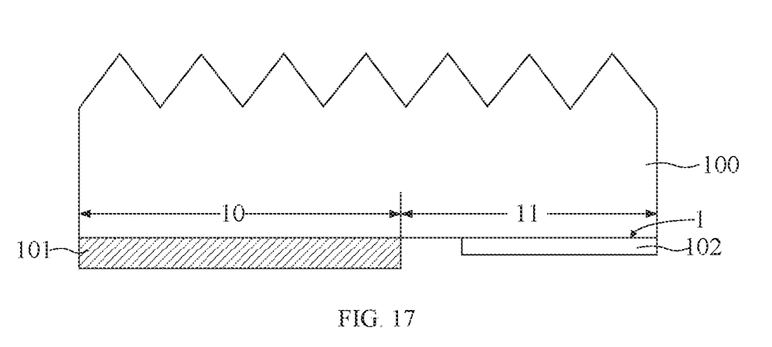
FIG. 17 is a cross-sectional structural view of a back-contact solar cell according to embodiments of the present disclosure.

FIG. 17 is a cross-sectional structural view of a back-contact solar cell according to embodiments of the present disclosure.

Referring to FIG. 17, a back-contact solar cell includes: a substrate 100 having a first surface 1; first doping layers 101 and target second doping layers 102 that are alternatingly arranged in a preset direction on the first surface 1, where the first doping layers 101 and the target second doping layers 102 have different conductivity types, and a respective first doping layer 101 and an adjacent target second doping layer 102 are spaced apart from each other.

In some embodiments, the conductivity type of the first doping layers 101 is different from that of the substrate 100, so as to form a P-N junction. The conductivity type of the target second doping layer 102 is the same as that of the substrate 100, and the doping concentration of the target second doping layer 102 is greater than that of the substrate 100, thus forming a high-low junction.

In some embodiments, the target second doping layer includes at least an amorphous silicon layer. Specifically, the material of the first doping layer may be polysilicon. The target second doping layer may include a polysilicon layer and an amorphous silicon layer sequentially stacked in a direction away from the first surface.

The number of grain boundaries of the amorphous silicon layer is lesser than that of polysilicon layer, and is difficult to be etched because the amorphous silicon layer has high density. In the process of actually separating the first doping layers from the target second doping layers, an isolation gap separating the first doping layers from the target second doping layers can be formed by taking the amorphous silicon layer of the target second doping layer as a mask, taking advantage of the difficulty of etching amorphous silicon.

Referring to FIG. 14, in some embodiments, the back-contact solar cell further includes a first passivation layer 103, where the first passivation layer 103 is disposed on the first doping layers 101 and the target second doping layers 102, and the first passivation layer 103 further fills gaps between the first doping layers 101 and the target second doping layers 102.

In some embodiments, the first passivation layer 103 may be a single-layer structure. In other embodiments, the first passivation layer 103 may also be a multi-layer structure. In some embodiments, a material of the first passivation layer 103 may be at least one of silicon oxide, aluminum oxide, silicon nitride, and silicon oxynitride.

In some embodiments, the back-contact solar cell may further include a second passivation layer 104 located on a surface of the substrate 100 facing away from the first passivation layer 103.

In some embodiments, the second passivation layer 104 may be a single-layer structure. In other embodiments, the second passivation layer 104 may also be a multi-layer structure. In some embodiments, a material of the second passivation layer 104 may be at least one of silicon oxide, aluminum oxide, silicon nitride, or silicon oxynitride.

Referring to FIG. 16, in some embodiments, the back-contact solar cell further includes first electrodes 106 and second electrodes 107. The first electrodes 106 and the second electrodes 107 are alternatingly arranged in the preset direction. The first electrodes 106 penetrate the first passivation layer 103 to be in electrical contact with the first doping layers 101. The second electrodes 107 penetrate the first passivation layer 103 to be in electrical contact with the target second doping layers 102.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Although the present disclosure is disclosed as above with preferred embodiments, it is not intended to limit the claims. Any person skilled in the art can make several possible changes and modifications without departing from the concept of the present disclosure. Therefore, the scope of protection of the present disclosure shall be subject to the scope defined in the claims of the present disclosure.

Those of ordinary skill in the art will appreciate that the above-described embodiments are specific embodiments for implementing the present disclosure and that in practical situations, various changes may be made in form and detail thereof without departing from the spirit and scope of the present disclosure. Any person skilled in the art may make various changes and modifications without departing from the spirit and scope of this application, so the scope of protection of this application shall be subject to the scope defined by the claims.

What is claimed is:

1. A method for manufacturing a back-contact solar cell, comprising:
    providing a substrate having a first surface, wherein the first surface includes first regions and second regions that are alternatingly arranged in a preset direction;
    forming first doping layers over the first regions, wherein a respective first doping layer is over a respective first region;
    forming second doping layers over the second regions, wherein a respective second doping layer is over a respective second region, and the respective first doping layer and the respective second doping layer have different conductivity types, wherein each of the second doping layers includes two first portions and a second portion that are arranged in the preset direction, wherein the second portion is abutted on two opposite sides by the two first portions, and each first portion of the two first portions abuts a first doping layer on a side of the each first portion facing away from the second portion;
    forming mask layers on respective ones of the first doping layers during forming the first doping layers over the first regions and forming the second doping layers over the second regions;
    performing laser modification treatment on the second portions of the second doping layers to convert the second portions into target second doping layers, wherein the second doping layers include polysilicon, and each of the target second doping layers includes an amorphous silicon layer;
    performing an etching process on the first portions and the target second doping layers to remove the first portions, such that the first doping layers are separated from the target second doping layers by gaps, wherein an etching rate at which the target second doping layers are etched is lower than an etching rate at which the first portions are etched in the etching process; and
    removing the mask layers.

2. The method of claim 1, wherein, in the etching process, the first portions and a partial thickness of the substrate directly facing the first portions are removed.

3. The method of claim 1, wherein a ratio of a width of the respective first portion to the width of a respective second portion in the preset direction is in a range of 0.09 to 2.

4. The method of claim 1, wherein performing the laser modification treatment on the second portions includes:
    performing the laser modification treatment on the second portions from a surface of a respective second portion, to convert the respective second portion of at least a partial thickness into a modified layer, wherein the modified layer and a remaining portion of the respective second portion become a corresponding target second doping layer, wherein an etching rate at which the modified layer is etched is lower than an etching rate at which the first portions are etched in the etching process.

5. The method of claim 4, wherein the respective second portion of the partial thickness is converted into the modified layer by the laser modification treatment, and the first portions and the modified layer are removed in the etching process.

6. The method of claim 4, wherein a material of the modified layer includes amorphous silicon.

7. The method of claim 6, wherein a laser power of laser used for the laser modification treatment is in a range of 5 W to 40 W.

8. The method of claim 6, wherein the modified layer includes:
    an amorphous silicon layer and a silicon oxide layer stacked on a surface of the amorphous silicon layer away from the substrate, wherein in the etching process, the silicon oxide layer is etched at an etching rate lower than an etching rate at which the first portions are etched, and the amorphous silicon layer is etched at an etching rate lower than an etching rate at which the first portions are etched, and wherein the silicon oxide layer is removed in the etching process.

9. The method of claim 6, wherein the etching process is an alkali etching process.

10. The method of claim 9, wherein process parameters for the alkali etching process includes: an etching liquid being a NaOH solution with a mass concentration of 0.5% to 5%, a temperature of the etching liquid being 60° C. to 80° C., and a process duration being 240 s to 500 s.

11. The method of claim 1, wherein the method further comprises:
    after forming the first doping layers, wherein the first doping layers are doped with a first doping element, forming the second doping layers, includes:
    forming polysilicon layers on the second regions, wherein a respective polysilicon layer is formed over the respective second region; and
    performing a diffusion process on the polysilicon layers to implant a second doping element, having a conductivity type that is different from a conductivity type of the first doping element, into the polysilicon layers to convert the polysilicon layers into the second doping layers.

12. The method of claim 11, wherein performing the diffusion process on the polysilicon layers includes:
    depositing a doping source on the polysilicon layers, wherein the doping source includes the second doping element; and
    introducing oxygen into a diffusion furnace during depositing of the doping source, and diffusing at a temperature of 700° C. to 1000° C. for a duration of 1 h to 3 h to form the second doping layers.

13. The method of claim 1, wherein the method further comprises:
    removing the first portions and a partial thickness of the substrate facing the first portions in the etching process, wherein the partial thickness of the substrate is in a range of 1 μm to 6 μm.

14. The method of claim 1, wherein forming the mask layers on the respective ones of the first doping layers during forming the second doping layers over the second regions includes:
    forming second doping layers over respective ones of the first doping layers, wherein the second doping layers over the first doping layers constitute the mask layers; and
    removing the second doping layers over the first doping layers in the etching process.

15. The method of claim 14, wherein a respective mask layer of the mask layers includes a first glass layer and a respective second doping layer on the first glass layer, wherein the first glass layer includes a first doping element doped into the first doping layers, and the second doping layer includes a second doping element, wherein the first doping element and the second doping element have different conductivity types.

16. The method of claim 1, wherein the method further comprises:
   forming a first passivation layer, wherein the first passivation layer is disposed on the first doping layers and the target second doping layers, and the first passivation layer further fills the gaps between the first doping layers and the target second doping layers.

17. The method of claim 1, wherein forming the mask layers on the respective ones of the first doping layers during forming the first doping layers over the first regions includes:
   forming first glass layers on the respective ones of the first doping layers, wherein a respective first glass layer includes a first doping element doped into the first doping layers, and silicon and oxygen elements.

18. The method of claim 17, wherein the respective first doping layer has a thickness in a range of 0.7 μm to 1.3 μm, and the first glass layer has a thickness in a range of 100 nm to 200 nm.

\* \* \* \* \*